United States Patent [19]

Eitan

[11] Patent Number: 4,649,520

[45] Date of Patent: Mar. 10, 1987

[54] SINGLE LAYER POLYCRYSTALLINE FLOATING GATE

[75] Inventor: Boaz Eitan, Sunnyvale, Calif.

[73] Assignee: WaferScale Integration Inc., Fremont, Calif.

[21] Appl. No.: 669,198

[22] Filed: Nov. 7, 1984

[51] Int. Cl.[4] ............................................... G11C 11/40

[52] U.S. Cl. ..................................... 365/185; 365/184

[58] Field of Search ................ 365/185, 184, 189, 230

[56] References Cited

U.S. PATENT DOCUMENTS 4,599,706 7/1986 Guterman ........................... 365/185

*Primary Examiner*—Terrell W. Fears

*Attorney, Agent, or Firm*—Alan H. MacPherson; Steven F. Caserza; Richard Franklin

[57] ABSTRACT

A programmable read only memory includes a transistor having an N type source, an N type drain, and a polysilicon floating gate extending over the channel between the source and drain. The floating gate also extends over and is capacitively coupled to an N well. By applying an electric potential to the N well, the potential on the floating gate above the channel is altered.

Within the N well is a P region, which mitigates the decrease in capacitive coupling between the N well and the floating gate caused by carrier depletion.

14 Claims, 9 Drawing Figures

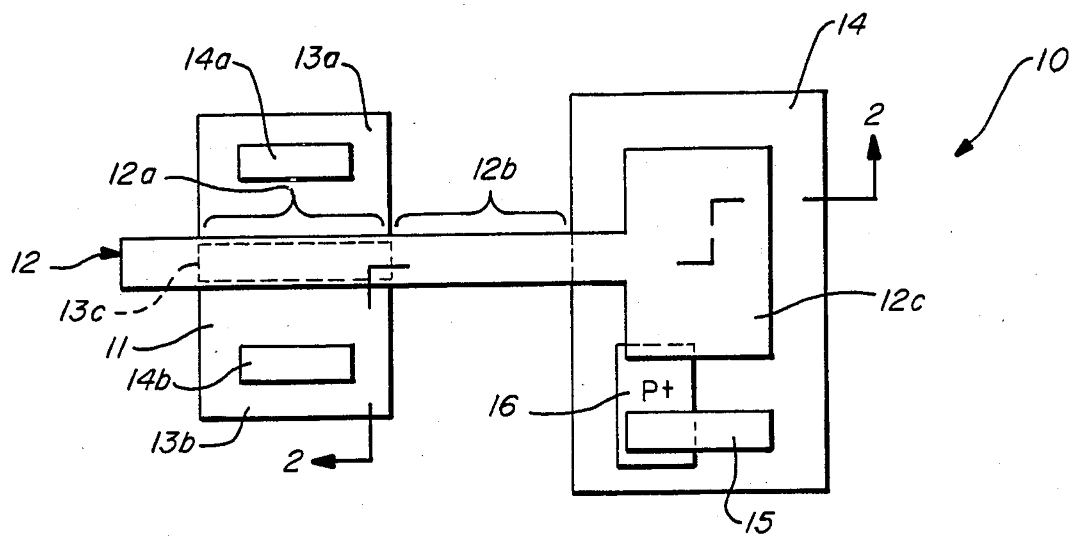
FIG._1
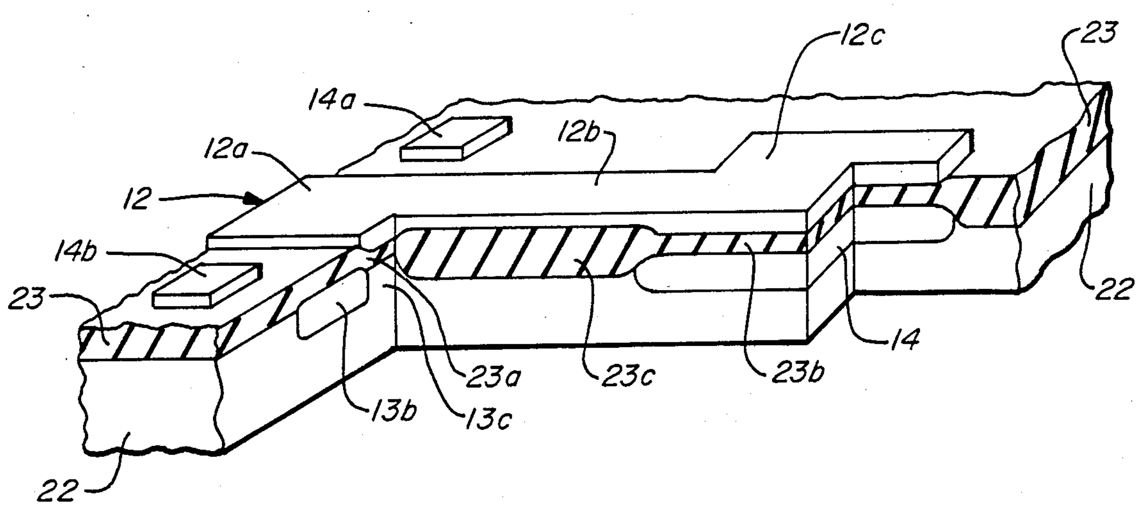
FIG._2

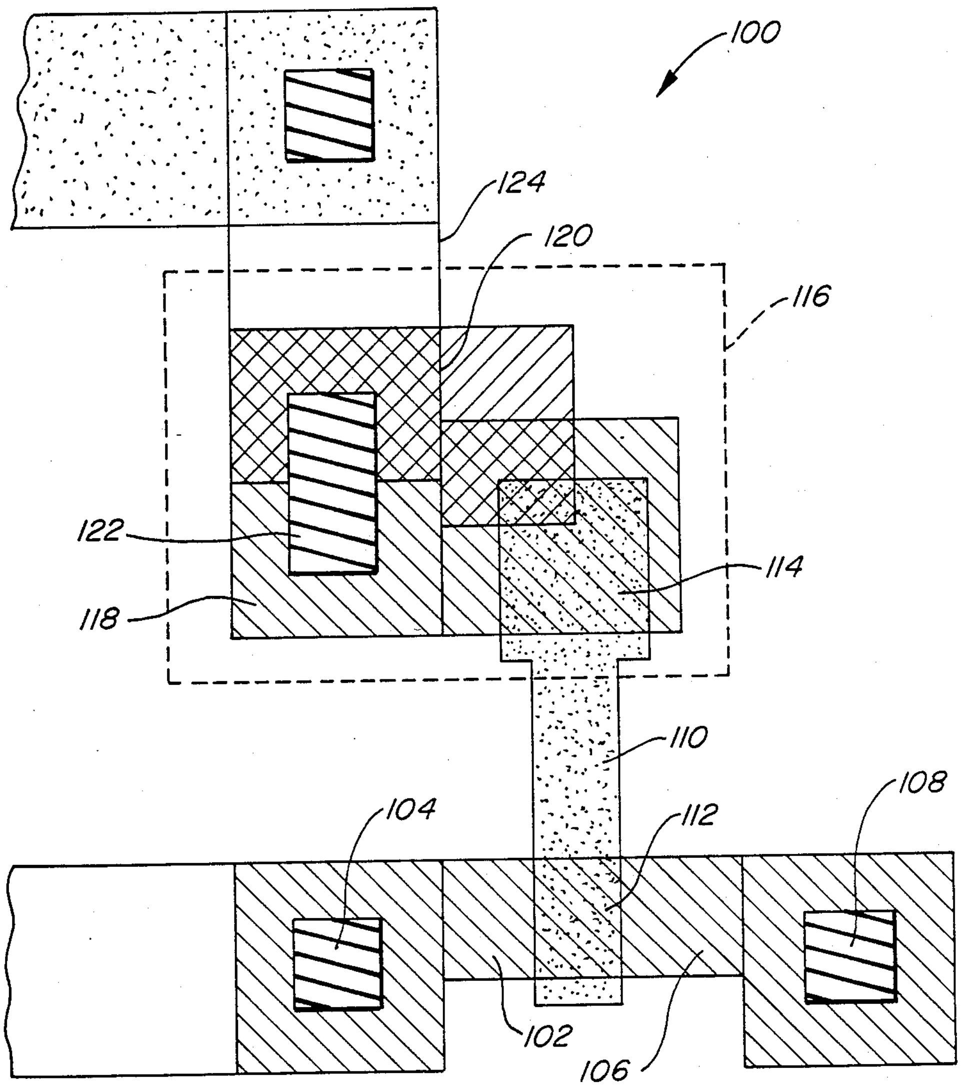
FIG._3

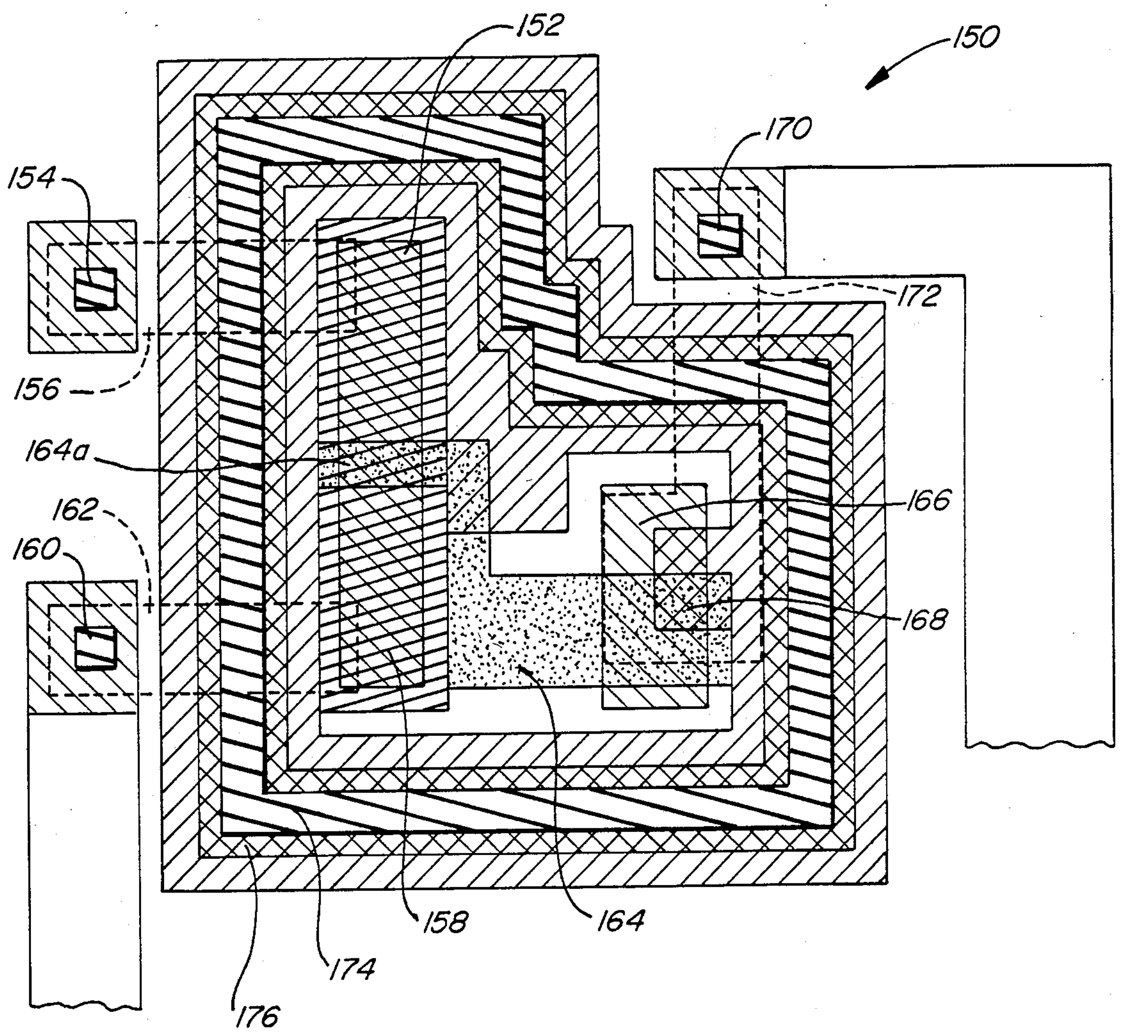
FIG._4

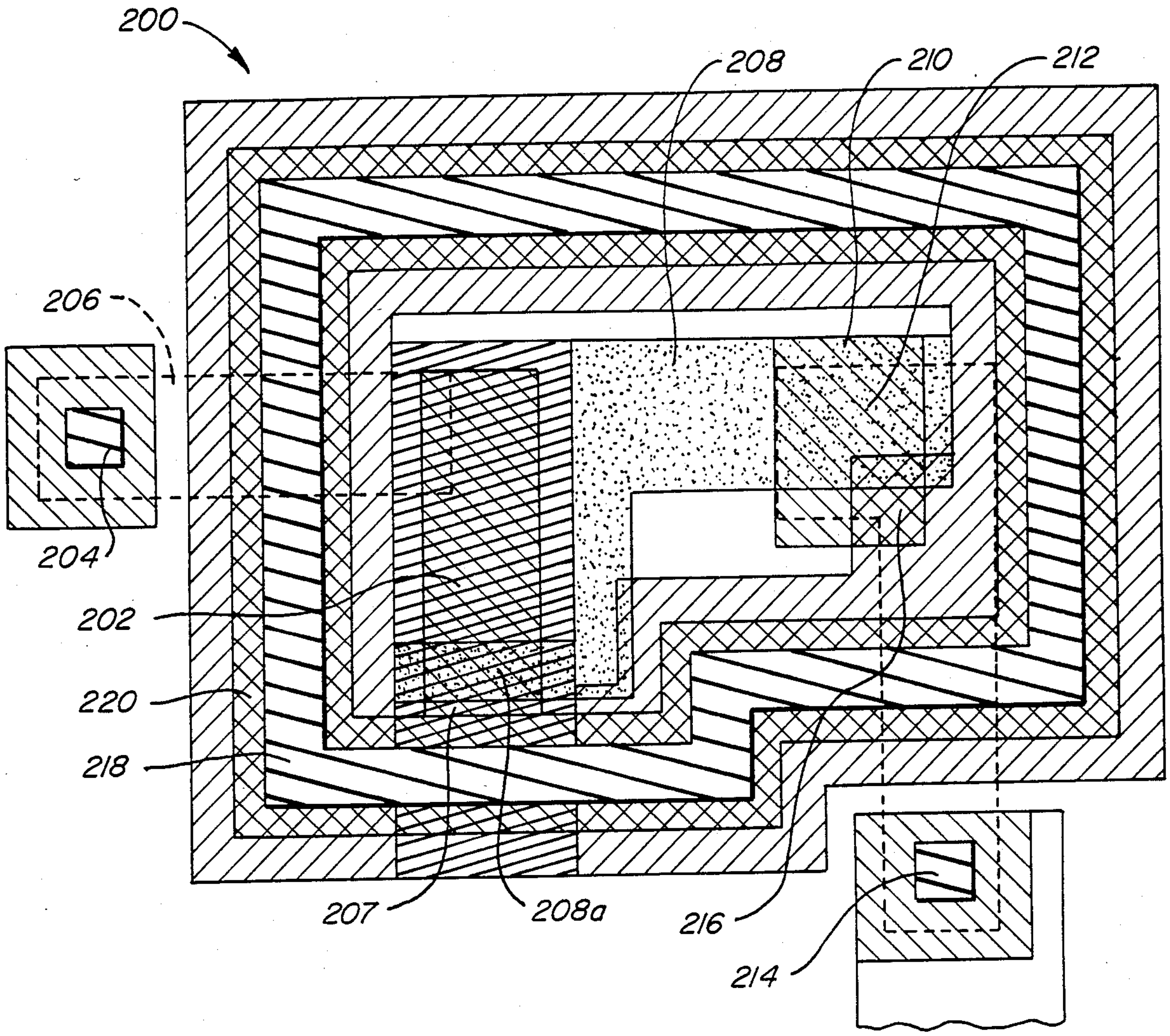
FIG._5

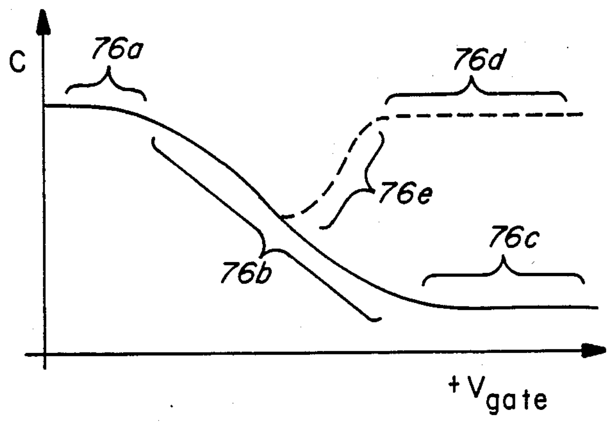
FIG._6a
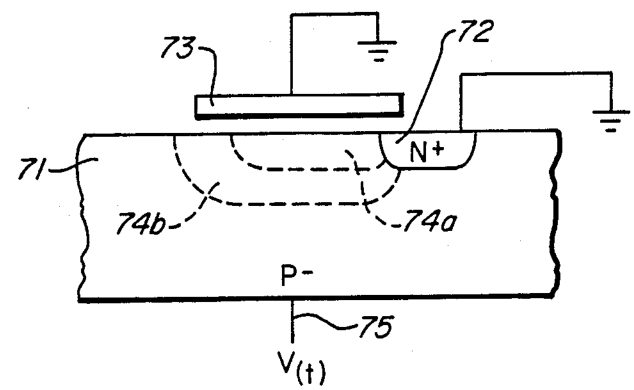
FIG._6b
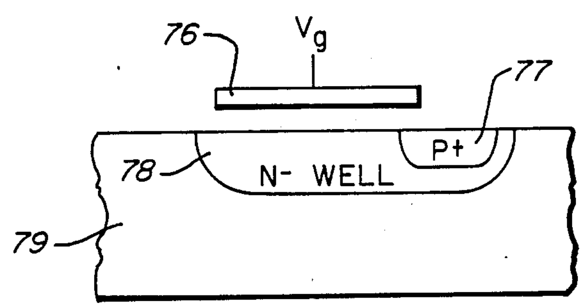
FIG._6c
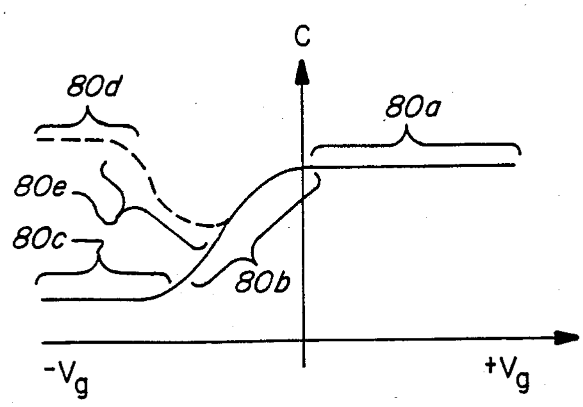
FIG._6d

SINGLE LAYER POLYCRYSTALLINE FLOATING GATE

BACKGROUND OF THE INVENTION

1. Field of the Invention

This invention relates to read only memories and in particular to a read only memory formed using a single layer polycrystalline silicon floating gate.

2. Prior Art

Programmable read only memories ("PROMs") are well known. Such memories can be formed in any one of a number of way. In PROM structures employing floating gates of the type disclosed in U.S. Pat. No. 4,328,565, wherein the floating gates are each overlain by a control gate comprising a second layer of conductive material such as polycrystalline silicon, those transistors which are to store a binary zero (one) have placed on the floating gate associated therewith a charge which changes the transistor's threshold voltage compared to the threshold voltage of the transistors which are to store a binary one (zero). An extensive art has developed in this technology and there are a number of different ways by which the charge can be placed on or removed from such floating gates.

Another generic class of PROMs uses programmable fuses. By passing sufficient current through a given fuse, the fuse is destroyed and a binary one (zero) is stored in the destroyed fuse, whereas an undestroyed fuse represents a binary zero (one). When it is desired to use a single layer of polycrystalline silicon in the resulting ROM there are only two ways in general in which one can manufacture the ROM. First, the ROM can be designed into the mask set, in which case the presence or absence of the single layer of polysilicon determines whether or not a functional transistor is obtained at a given address. Such a ROM cannot be changed. Second, a programmable fuse can be used which is programmed by passing sufficient current through the fuse at a selected voltage to destroy the fuse, thereby to store a binary one or zero.

SUMMARY OF THE INVENTION

This invention provides a programmable read only memory transistor which uses a floating gate but which avoids the use of a control gate over the floating gate. In accordance with this invention, a floating gate is formed over and insulated from a channel region between a source and a drain. An extension of the floating gate is formed over but insulated from a well region formed laterally spaced from the source and drain. A separate electrical contact is made to the well region. By applying a voltage to the floating well, the potential on the floating gate is controlled. By simultaneously applying an appropriate voltage to the drain, hot electrons are injected onto the floating gate from the channel through the gate oxide between the floating gate and the channel underlying the floating gate. The well functions as a control gate and is capacitively coupled to the floating gate which is then capacitively coupled to the channel region of the transistor.

The coupling between the control gate (the floating well) and the floating gate can be controlled by properly selecting the area of the floating gate over the well in proportion to the area of the floating gate over the channel to achieve whatever coupling is desired.

This invention will be more fully understood in conjunction with the following detailed description taken together with the drawings.

DESCRIPTION OF THE DRAWINGS

FIG. 1 shows a top plan view of the floating gate buried well structure of this invention;

FIG. 2 illustrates a cross-sectional view of a portion of the structure shown in FIG. 1;

FIG. 3 illustrates in top view the layout of the structure of a second embodiment of this invention;

FIGS. 4 and 5 illustrate a third and fourth embodiment of this invention with a metal cap formed over the transistor, P well, and gate to prevent incident light from changing the charge stored on the gate; and FIGS. *6a, 6b, 6c* and *6d* illustrate the change in capacitance of a semiconductor substrate in response to voltage differences between the well and the floating gate.

DETAILED DESCRIPTION

While one embodiment of this invention will be described, other embodiments of this invention will be obvious to those skilled in the art in view of this disclosure.

In FIG. 1 is shown a transistor 10 comprising a source *13a* separated from a drain *13b* by a channel region *13c*. It should be understood that transistor 10 is part of an integrated circuit containing a plurality of transistors and other components and that this invention is being described in terms of one transistor only for simplicity. Overlying channel region *13c* but separated therefrom by insulation in floating gate 12. Portion *12a* of floating gate 12 extends over a portion of the channel region between the source *13a* and drain *13b* while portion *12b* of floating gate 12 extends beyond the channel region into contact with portion *12c* of floating gate overlying a well 14. If the substrate in which the source *13a* and drain *13b* is formed is of p-type semiconductor material, then source *13a*, drain *13b* and well 14 will be formed of n-type semiconductor material. In a standard CMOS process (and the structure of this invention is fabricated using standard CMOS processing), well 14 will be formed at the start of the process and source region *13a* and drain region *13b* will be formed later in the process. Overlying the semiconductor substrate in which transistor 10 is formed and separating portions *12a, 12b* and *12c* of gate 12 from the underlying semiconductor material is insulation, typically an oxide of the underlying semiconductor material. Electrical contact between well region 14 and a control voltage source (not shown) for controllng gate 12 is made through a conductive contact formed in window 15 through the insulation overlying well region 14 so as to allow electrical potential to be applied to well region 14.

FIG. 2 shows in cross-section a portion of the structure shown in FIG. 1. In FIG. 2 the relationship of floating gate 12 to underlying well region 14 and drain region *13b* is illustrated. Electrical contact *14b* to drain region *13b* is formed through an aperture (FIG. 1) in that portion of insulation layer 23 overlying the semiconductor material 22 in which is formed drain region *13b*. The portion *23a* (FIG. 2) of insulation 23 formed underneath floating gate *12a* over the channel *13c* between drain *13b* and source *13a* is, as is well known in the semiconductor arts, thinner than the field-oxide such as oxide *23c*. Insulation portion *23a* between gate portion *12a* and the channel region between source *13a* and drain *13b* is in one embodiment about 350 Å to 400 Å thick. The oxide 23*b* between portion 12*c* of floating gate 12 and well region 14 is the same thickness as the oxide between portion 12*a* of floating gate 12 and the underlying channel region.

In operation, the application of a voltage to electrical contact 15 (FIG. 1) and thereby to well region 14, by capacitive coupling induces potential on floating gate 12. By controlling the ratio of the area of portion 12*c* to area 12*a* of the floating gate, the capacitive coupling or gate coupling rates between the control region comprising well region 14 and the channel region underneath floating gate 12*a* can be controlled. This relationship can be calculated knowing the capacitance $C_{well,FG}$ between well 14 and floating gate portion 12*c*, the capacitance $C_{tran}$ between the transistor channel and floating gate portion 12*a*, and the capacitance $C_{field}$ between portion 12*b* of gate 12 and the underlying semiconductor material 22. Thus the gate coupling ratio is just $$GCR = \frac{C_{well,FG}}{\{(C_{well,FG} + C_{tran} + C_{field})\}}$$

$$\{ - \} = C_{Tot}$$

where GCR = gate coupling ratio.

To understand the operation of the transistor of this invention, assume substrate 22 is formed of p-type semiconductor material and well region 14, source region 13*a* and drain region 13*b* are formed of n-type semiconductor material. The application of a positive voltage to well region 14 will capacitively couple a positive voltage to gate 12 and thereby result in a positive potential being applied across oxide 23*a* to the underlying channel 13*c* in semiconductor material 22. The simultaneous application of a positive drain voltage $V_D$ to drain 13*b* and a positive voltage to gate 12 results in electrons accelerating from the source 13*a* (not shown in FIG. 2) along the channel region 13*c* underneath gate 12*a* towards the drain 13*b*. Hot electrons are then injected over the potential barrier of the insulation 23*a* between the channel 13*c* and floating gate 12. This programming is identical to the way standard EPROMs are programmed in the prior art onto floating gate 12. Consequently, when a voltage is subsequently applied to well 14 (corresponding to the control gate in the dual layer prior art), the threshold voltage required to turn on the transistor comprising source region 13*a*, drain region 13*b*, and channel region 13*c* will be raised over what would normally be expected and thus the storage of information in transistor 10 can be detected.

Typically, well 14 has a dopant concentration of about $8\times10^{15}$ to $1\times10^{17}$ atoms per cubic centimeter. In construction, the well 14 associated with the transistor 10 can be located at any geographically proximate location and does not have to be located directly adjacent to the source and drain and channel regions of the transistor to which the gate 12 is connected. In fact, portion 12*b* can be bent or twisted as desired to take advantage of layout economies and geometric constraints on the desired circuit.

The structure described above is particularly useful in CMOS processes. In fact this structure can be made without altering the standard CMOS processes currently in use. In one embodiment,, the source 13*a* and drain 13*b* are formed to a depth of about 0.5 micron and well 14 is formed to a depth of about 4 microns. The impurity used to form source 13*a* and drain 13*b* is an N type impurity (for example arsenic) implanted to a density of approximately 4 times $10^{15}$ per centimeter square while the impurity used to form well 14 is also an N type impurity (for example, also arsenic) implanted to a density of 8 time $10^{12}$ per centimeter square.

The use of well 14 with a dopant concentration in the range set forth above allows good quality oxide to be formed between well 14 and the overlying floating gate 12. While the lateral spacing between well 14 on the one hand, and source 13*a* and drain 13*b* on the other hand must be sufficient (seven microns in one embodiment) to take into account the lateral expansion of well 14 during the subsequent high temperature processing steps associated with the CMOS process, this lateral spacing can be reduced in an alternative embodiment which substitutes an N+ region (typical doping concentration of about $10^{19}$ atoms per cubic centimeter) for the preferred N-well. This N+ region is formed later in the process than the N-well. This alternative embodiment, however, has the drawback of requiring an extra mask step to form the N+ region and has the further drawback that good quality thermal oxide is difficult to form from the heavily doped silicon in the N+ region.

While the structure of this invention utilizes a capacitive coupling between the N type well formed in the semiconductor substrate and the polysilicon gate formed over but insulated from a portion of the well, the capacitance between these two structures (which is the series capacitance of the oxide and the depletion region under the oxide) is itself dependent upon the voltage difference between the floating gate and the well.

In the structure of this invention as shown, for example, in FIGS. 1 and 2, the capacitance between well 14 and gate 12 must be maintained above a certain value in order to maintain high the gain of the transistor consisting of source 13*a*, drain 13*b* and the channel region therebetween together with the overlying gate portion 12*a*. Deep depletion, which reduces the capacitive coupling between well 14 and control gate 12, can be avoided by providing minority carriers. These minority carriers are supplied in the structure of FIG. 6*c* by the addition of P+ region 77 formed in N well 78. When N well 78 starts to go into deep depletion, minority carriers are passed through the PN junction between region 77 and well 78 thereby preventing N well 78 from reaching deep depletion. This is shown in FIG. 6*d* where the capacitance is shown to recover by line 80*d*.

In view of the above described phenomenon, it is necessary to add to the N well 14 described above in conjunction with FIGS. 1 through 5 a P+ region to provide minority charge (holes) to the N well to prevent the dip in capacitance represented by regions 76*c* and 80*d* of FIGS. 6*a* and 6*d*.

FIGS. 3, 4 and 5 illustrate in top view the layout of three embodiments of this invention. Referring to FIG. 3, a transistor 100 includes a source region 102 electrically coupled to a source contact 104 and a drain region 106 electrically coupled to a drain contact 108. In this embodiment source region 102 and drain region 106 are each N diffused regions. Also illustrated in FIG. 3 is a polysilicon floating gate 110. A portion 112 of polysilicon gate 110 extends over the area between source 102 and drain 106. Underneath gate portion 112 is formed the channel region for transistor 100. When the voltage potential of gate portion 112 rises above the threshold voltage for transistor 100, an N type channel region (not shown) is formed beneath gate portion 112 to electrically connect source 102 and drain 106. Polysilicon gate 110 is formed on insulation over the channel region before source 102 and drain 106 are formed and thus serves as a mask to prevent the channel of transistor 100 from being doped with N type impurities during fabrication. As is well known in the art, source 102 and drain 106 are thus self-aligned with the gate portion 112 and the underlying channel.

A portion 114 of polysilicon floating gate 110 extends over but is insulated from an N doped well region 116. Included with N well region 116 is an N+ doped region 118 and a P region 120. However, as described above, polysilicon gate 110 is electrically isolated from N well 116, N+ region 118 and P+ region 120 by a layer of insulation, typically an oxide of silicon. P+ region 120 and N+ region 118 are connected together electrically by a contact 122. Contact 122 is also electrically connected to a metal region 124 which is electrically connected to a controlling voltage source (not shown).

In operation, a controlling voltage (positive relative to the substrate) is applied to N+ region 118 and P region 120. Since N+ region 118 and P region 120 are capacitively coupled to polysilicon gate 110, this controlling voltage causes an increase in the voltage potential of polysilicon gate 110. If the potential of gate 110 is increased sufficiently a conductive channel is formed between source 102 and drain 106 as described above. Also as described above, P region 120 mitigates the change in capacitive coupling between N+ region 118 and polysilicon gate 110 in response to carrier depletion in N+ region 118.

FIG. 4 illustrates a transistor 150 in accordance with a second embodiment of the invention. A drain region 152 is electrically coupled to a contact 154 via an N well 156 formed in a P type substrate. Similarly, a source region 158 is electrically coupled to a contact 160 via an N well 162 formed in the P type substrate. Both drain 152 and source 158 are N type diffused regions. A polysilicon floating gate 164 has a portion 164a which extends on insulation between drain 152 and source 158. Polysilicon gate 164 also extends on insulation over an N region 166 and a P+ region 168. N region 166 is coupled to contact 170 via an N well 172 formed in the P type substrate. Polysilicon gate 164 is electrically isolated from N region 166 and P region 168 by insulation, typically an oxide of silicon formed in a well known manner. In one embodiment, N region 166 is a diffused region whereas P region 168 is fabricated by ion implantation. As is the case with the embodiment of FIG. 3, P region 168 serves to mitigate the reduction in capacitance between gate 164 and N region 166 in response to depletion of N carriers from N region 166.

Transistor 150 is surrounded by a metal wall 174 (typically aluminum) which is placed over a P region 176. Wall 174 is in ohmic contact with P region 176, which in turn is electrically connected to the substrate. Metal wall 174 is formed on a closed annular-shaped surface portion of the P type substrate, thus forming a wall surrounding transistor 150. On top of wall 174 is also found opaque material such as aluminum (not shown in the plan view of FIG. 4 to better illustrate transistor 150). This opaque material thus completely shields transistor 150 from light. This prevents stray light from traveling along and through insulation such as an oxide of silicon (preferably silicon dioxide) or silicon nitride thereby preventing light from affecting the state of the charge on the floating gate 164.

To summarize, source 158, drain 152, N well 166, and gate 164 are completely covered by an opaque cover. This prevents light from striking gate 164 and altering the charge stored thereon.

Transistor 150 operates in the same manner as transistor 10 of FIG. 1 and transistor 100 of FIG. 3. By applying a positive potential to well 166, the potential of gate 164 is increased. The simultaneous application of a high voltage to drain 152 and gate 164 results in electrons being injected over the potential barrier of the insulation between the channel and gate 164. This raises the threshold voltage for transistor 150.

FIG. 5 illustrates the geometry of another N channel transistor in accordance with the present invention. N channel transistor 200 includes an N drain region 202 connected to electrical contact 204 via a conductive N well region 206 formed in a P type substrate. Transistor 200 also includes an N source region 207 which is electrically connected to the P type substrate by the opaque metal such as aluminum 218 in electrical ohmic contact with both N+ source region 207 and the P type substrate. Between drain 202 and source 207 is a channel over which lies a portion 208a of a polysilicon floating gate 208. An N type channel forms between drain 202 and source 207 when the potential on floating gate 208 rises above the threshold voltage of transistor 200.

Polysilicon gate 208 extends over a region 210 where an N well region 212 is formed. N well region 212 extends beneath opaque material 218 and outside the border of material 218. Outside the border of material 218, N well region 212 is electrically connected to a contact 214, which in turn is coupled to a controlling voltage source (not shown). Also extending underneath polysilicon gate 208 within N type well region 212 is P+ diffusion 216. P+ diffusion 216 modifies the capacitive coupling between N region 212 and polysilicon gate 208 as described above to prevent depletion of the well region 212 and the resulting large change of capacitance. Also as described above, polysilicon gate 208 is electrically isolated from P region 216 and N well 212 by a layer of insulation, typically silicon oxide.

As can be seen from FIG. 5, transistor 200 is surrounded by an opaque metal wall 218. Metal wall 218 rests on and is electrically coupled to a P region 220 formed in the P type substrate by ion implantation. Metal wall 218 serves as lateral support for an opaque cover (not shown) also formed on the same metal in one embodiment which prevents light from striking transistor 200 and altering the charge stored on floating gate 208.

Transistor 200 is programmed in a manner identical to that used to program transistor 150 (FIG. 4), transistor 100 (FIG. 3) and transistor 10 (FIG. 1).

A major advantage of this invention is that it uses standard CMOS processing without additional masks or process steps. Moreover, the use of an N-well as the structure for coupling voltages to the floating gate makes it relatively easy to obtain high quality thermal oxide as the insulation between the floating gate and the well region.

While the invention has been described in detail with references to particular embodiments, those skilled in the art will appreciate that minor modifications can be made without departing from the spirit and scope of the invention. For example, the disclosed transistors could be either P channel or N channel transistors. Also, the insulation layers could include silicon nitride or other appropriate insulating materials. Accordingly, all such changes come within the scope of this invention, as delineated by the following claims.

I claim:

1. A programmable read only memory comprising
a substrate of a first conductivity type;
a source region of a second conductivity type opposite to said first conductivity type formed in said substrate;
a drain region of said second conductivity type formed in said substrate and separated from said source region by a first intermediate region of said substrate;
a third region of said second conductivity type formed in said substrate and separated from said source region and said drain region by a second intermediate region of said substrate;
insulation formed over said source region, said drain region, said third region, and said first and second intermediate regions;
conductive means for causing a conductive path to form between said source region and said drain region, said conductive means formed on said insulation and extending over said third region, said second intermediate region and said first intermediate region; and
means for applying a first electrical potential to said source region, a second electrical potential to said drain region and a third electrical potential to said third region.

2. A programmable read only memory as in claim 1 wherein said first intermediate region comprises a channel region between said source region and said drain region.

3. A programmable read only memory as in claim 1 wherein said means for applying a first electrical potential to said source region, a second electrical potential to said drain region and a third electrical potential to said third region comprises a first via formed through said insulation to said source region, a second via formed through said insulation to said drain region and a third via formed through said insulation to said third region, each of said first, second and third vias containing an electrically conductive material formed in ohmic contact with the underlying source region, drain region and third region respectively.

4. A programmable read only memory as in claim 3 including:
means for applying a first electrical potential to said contact material in said first via;
means for applying a second electrical potential to said contact material in said second via; and
means for applying a third electrical potential to said contact material in said third via
thereby to generate a potential on said conductive material, said potential thereby controlling the conductivity of the first intermediate region between said source region and said drain region.

5. A programmable read only memory as in claim 4 wherein said third region comprises a well region for receiving an electrical potential thereby to control the electrical potential on said conductive means formed over said first intermediate region, said second intermediate region and said third regions.

6. A programmable read only memory as in claim 1 wherein said conductive means completely covers the first intermediate region between said source region and said drain region thereby to control the conductivity of said first intermediate region.

7. A programmable read only memory as in claim 6 including opaque means formed over said first intermediate region, said second intermediate region, said source region, said drain second region and a portion of said third region to prevent light from striking said regions.

8. A programmable read only memory as in claim 1 wherein said first conductivity type is P type and said second conductivity type is N type.

9. A programmable read only memory as in claim 1 further comprising a fourth region of said first conductivity type located adjacent to said third region, said fourth region extending underneath said conductive means.

10. A programmable read only memory as in claim 1 further comprising means for coupling said source region to said substrate.

11. A programmable read only memory comprising:
an MOS transistor having a source region, a drain region and a channel region therebetween, all formed in a semiconductor substrate, and a floating gate formed over, but insulated from the channel region,
means for applying selected potentials to said source region and said drain region,
a well region formed in said substrate laterally spaced from said source region, said drain region and said channel region;
a portion of said floating gate formed to extend on insulation over a portion of said well region; and
means for applying a potential to said well region thereby to change the charge stored on said floating gate and thereby to allow the threshold voltage of said MOS transistor to be changed.

12. Structure as in claim 11 wherein said well region is lightly doped.

13. Structure as in claim 12 wherein said well region is doped to a concentration of $8\times10^{15}$ to $1\times20^{17}$ atoms per cubic centimeter.

14. Structure as in claim 11 including an opaque material formed over said MOS transistor, said well region and said floating gate, said opaque material coming into contact with said substrate, thereby to prevent light from changing the charge stored on said floating gate.

* * * * *